United States Patent
Choi

(10) Patent No.: US 11,637,089 B2
(45) Date of Patent: Apr. 25, 2023

(54) SEMICONDUCTOR PACKAGE INCLUDING STACKED SEMICONDUCTOR CHIPS

(71) Applicant: SK hynix Inc., Icheon-si (KR)

(72) Inventor: Bok Kyu Choi, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 136 days.

(21) Appl. No.: 17/154,475

(22) Filed: Jan. 21, 2021

(65) Prior Publication Data

US 2022/0068884 A1 Mar. 3, 2022

(30) Foreign Application Priority Data

Aug. 31, 2020 (KR) .................... 10-2020-0110138

(51) Int. Cl.
*H01L 25/065* (2006.01)
*H01L 23/538* (2006.01)
(Continued)

(52) U.S. Cl.
CPC ...... *H01L 25/0657* (2013.01); *H01L 23/3185* (2013.01); *H01L 23/367* (2013.01); *H01L 23/5384* (2013.01); *H01L 23/5385* (2013.01); *H01L 23/5386* (2013.01); *H01L 24/48* (2013.01); *H01L 2224/48225* (2013.01);
(Continued)

(58) Field of Classification Search
CPC ............. H01L 25/0657; H01L 23/5385; H01L 23/5384; H01L 23/5386; H01L 23/481; H01L 23/49827; H01L 23/528; H01L 2225/06541; H01L 2225/06548

See application file for complete search history.

(56) References Cited

U.S. PATENT DOCUMENTS 8,289,806 B2 * 10/2012 Gomm ...................... G11C 8/18
  327/158
8,866,281 B2 * 10/2014 Huang ................ H01L 25/0652
  257/737

(Continued)

FOREIGN PATENT DOCUMENTS

KR 1020200031725 A 3/2020

*Primary Examiner* — Victor A Mandala
*Assistant Examiner* — Lawrence C Tynes, Jr.
(74) *Attorney, Agent, or Firm* — William Park & Associates Ltd.

(57) ABSTRACT

A semiconductor package may include a base layer; a first semiconductor chip disposed over and spaced apart from the base layer; a second semiconductor chip stack disposed between the base layer and the first semiconductor chip, the second semiconductor chip stack including a plurality of second semiconductor chips that are stacked in a vertical direction; a bridge die stack disposed between the base layer and the first semiconductor chip and disposed to be spaced apart from the second semiconductor chip stack, the bridge die stack including a plurality of bridge dies that are stacked in the vertical direction and electrically connecting the first semiconductor chip and the base layer to supply power; and a vertical interconnector disposed between the base layer and the first semiconductor chip and disposed to be spaced apart from the second semiconductor chip stack and the bridge die stack, the vertical interconnector electrically connecting the first semiconductor chip and the base layer to transmit a signal.

24 Claims, 13 Drawing Sheets

(51) Int. Cl.
 *H01L 23/00* (2006.01)
 *H01L 23/31* (2006.01)
 *H01L 23/367* (2006.01)

(52) U.S. Cl.
 CPC ............... *H01L 2225/06541* (2013.01); *H01L 2225/06548* (2013.01)

(56) References Cited

U.S. PATENT DOCUMENTS

| | | | | |
|---|---|---|---|---|
| 9,899,293 | B2* | 2/2018 | Groothuis | H01L 23/49827 |
| 9,941,253 | B1* | 4/2018 | Jung | H01L 25/50 |
| 10,134,655 | B2* | 11/2018 | Groothuis | H01L 23/481 |
| 10,134,712 | B1* | 11/2018 | Veches | H01L 25/0657 |
| 10,903,196 | B2* | 1/2021 | Sung | H01L 23/5383 |
| 11,302,646 | B2* | 4/2022 | Hsieh | H01L 25/0652 |
| 2009/0039492 | A1* | 2/2009 | Kang | G11C 5/02 |
| | | | | 257/E23.012 |
| 2009/0267238 | A1* | 10/2009 | Joseph | H01L 23/49833 |
| | | | | 438/109 |
| 2013/0105939 | A1* | 5/2013 | Domae | H01L 23/5385 |
| | | | | 257/528 |
| 2014/0159247 | A1* | 6/2014 | Lyne | H01L 23/49827 |
| | | | | 228/101 |
| 2014/0347943 | A1* | 11/2014 | Kim | G11C 29/886 |
| | | | | 365/200 |
| 2015/0287672 | A1* | 10/2015 | Yazdani | H01L 23/49827 |
| | | | | 257/774 |
| 2016/0056101 | A1* | 2/2016 | Jee | H01L 25/0657 |
| | | | | 257/737 |
| 2016/0211241 | A1* | 7/2016 | Law | H01L 25/0657 |
| 2016/0218085 | A1* | 7/2016 | Groothuis | H01L 25/0657 |
| 2018/0158751 | A1* | 6/2018 | Groothuis | H01L 23/49827 |
| 2019/0051578 | A1* | 2/2019 | Groothuis | H01L 25/0657 |
| 2019/0333834 | A1* | 10/2019 | Sung | H01L 23/49827 |
| 2020/0020641 | A1* | 1/2020 | Ko | H01L 21/78 |
| 2020/0075490 | A1* | 3/2020 | Sung | H01L 24/73 |
| 2020/0075542 | A1* | 3/2020 | Sung | H01L 24/17 |
| 2020/0091123 | A1* | 3/2020 | Sung | H01L 21/561 |
| 2020/0098720 | A1* | 3/2020 | Yu | H01L 24/06 |
| 2020/0105719 | A1* | 4/2020 | Li | H01L 25/50 |
| 2020/0118908 | A1* | 4/2020 | Yu | H01L 23/3677 |
| 2020/0126917 | A1* | 4/2020 | Kaeding | H01L 27/14618 |
| 2020/0144170 | A1* | 5/2020 | Yazdani | H01L 23/49827 |
| 2020/0158776 | A1* | 5/2020 | Jeong | H01L 25/0657 |
| 2020/0243422 | A1* | 7/2020 | Kim | H01L 23/49816 |
| 2020/0321315 | A1* | 10/2020 | Yu | H01L 24/94 |
| 2020/0335480 | A1* | 10/2020 | Hwang | H01L 23/3675 |
| 2020/0343218 | A1* | 10/2020 | Hu | H01L 24/08 |
| 2020/0357750 | A1* | 11/2020 | Chen | H01L 21/486 |
| 2020/0402960 | A1* | 12/2020 | Chen | H01L 23/3121 |
| 2021/0020574 | A1* | 1/2021 | Yu | H01L 21/6835 |
| 2021/0050328 | A1* | 2/2021 | Lee | H01L 25/0652 |
| 2021/0074641 | A1* | 3/2021 | Sung | H01L 23/3121 |
| 2021/0143126 | A1* | 5/2021 | Choi | H01L 25/50 |
| 2021/0143128 | A1* | 5/2021 | Choi | G11C 5/025 |
| 2021/0193622 | A1* | 6/2021 | Choi | H01L 23/5384 |
| 2021/0217729 | A1* | 7/2021 | Kandala | H01L 23/528 |
| 2021/0305226 | A1* | 9/2021 | Tsai | H01L 25/0657 |
| 2022/0310450 | A1* | 9/2022 | Kajigaya | H01L 21/8239 |

\* cited by examiner

SEMICONDUCTOR PACKAGE INCLUDING STACKED SEMICONDUCTOR CHIPS

CROSS-REFERENCE TO RELATED APPLICATION

This application claims priority under 35 U.S.C. § 119 to Korean Patent Application No. 10-2020-0110138 filed on Aug. 31, 2020, which is incorporated herein by reference in its entirety.

BACKGROUND

1. Technical Field

This patent document relates to a semiconductor technology, and more particularly, to a semiconductor package in which a plurality of semiconductor chips are stacked in a vertical direction.

2. Related Art

Electronic products require multifunctional and high-volume data processing with their sizes continuously getting smaller. Accordingly, there is a growing need to increase the degree of integration of semiconductor devices that are used in such electronic products.

However, due to the limitation of semiconductor integration technology, it is difficult to satisfy required functions with only a single semiconductor chip, and thus, a semiconductor package in which a plurality of semiconductor chips are embedded has been manufactured.

SUMMARY

In an embodiment, a semiconductor package may include: a base layer; a first semiconductor chip disposed over and spaced apart from the base layer; a second semiconductor chip stack disposed between the base layer and the first semiconductor chip, the second semiconductor chip stack including a plurality of second semiconductor chips that are stacked in a vertical direction; a bridge die stack disposed between the base layer and the first semiconductor chip and disposed to be spaced apart from the second semiconductor chip stack, the bridge die stack including a plurality of bridge dies that are stacked in the vertical direction and electrically connecting the first semiconductor chip and the base layer to supply power; and a vertical interconnector disposed between the base layer and the first semiconductor chip and disposed to be spaced apart from the second semiconductor chip stack and the bridge die stack, the vertical interconnector electrically connecting the first semiconductor chip and the base layer to transmit a signal.

In another embodiment, a semiconductor package may include: a base layer; a first semiconductor chip disposed over and spaced apart from the base layer; a second semiconductor chip stack disposed between the base layer and the first semiconductor chip, the second semiconductor chip stack including a plurality of second semiconductor chips that are stacked in a vertical direction; a first bridge die stack disposed between the base layer and the first semiconductor chip and disposed to be spaced apart from the second semiconductor chip stack, the first bridge die stack including a plurality of first bridge dies that are stacked in the vertical direction and electrically connecting the first semiconductor chip and the base layer to supply power; and a second bridge die stack disposed between the base layer and the first semiconductor chip and disposed to be spaced apart from the second semiconductor chip stack and the first bridge die stack, the second bridge die stack including a plurality of second bridge dies that are stacked in the vertical direction and electrically connecting the first semiconductor chip and the base layer to transmit a signal, wherein the first bridge die stack and the second bridge die stack are different from each other.

In another embodiment, a semiconductor package may include: a base layer; a first semiconductor chip disposed over and spaced apart from the base layer; a second semiconductor chip stack disposed between the base layer and the first semiconductor chip, the second semiconductor chip stack including a plurality of second semiconductor chips that are stacked in a vertical direction; a first interconnector disposed between the base layer and the first semiconductor chip and disposed to be spaced apart from the second semiconductor chip stack, the first interconnector electrically connecting the first semiconductor chip and the base layer to supply power; and a second interconnector disposed between the base layer and the first semiconductor chip and disposed to be spaced apart from the second semiconductor chip stack and the first interconnector, the second interconnector electrically connecting the first semiconductor chip and the base layer to transmit a signal, wherein at least one of a width and a pitch of the first interconnector is greater than that of the second interconnector.

DETAILED DESCRIPTION

Figure 1:
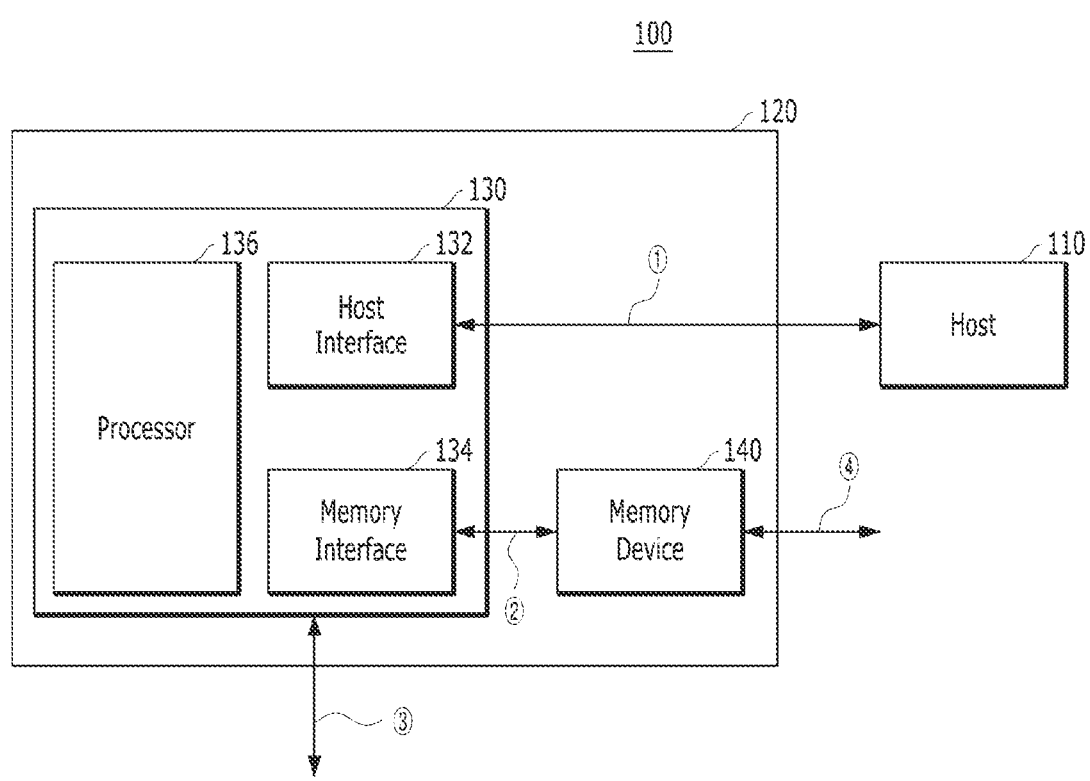
FIG. 1 is a view, schematically illustrating an example of a data processing system, including a memory system, according to an embodiment of the present disclosure.

Hereinafter, various embodiments of the disclosure will be described in detail with reference to the accompanying drawings.

The drawings are not necessarily drawn to scale. In some instances, proportions of at least some structures in the drawings may have been exaggerated in order to clearly illustrate certain features of the described embodiments. In presenting a specific example in a drawing or description with two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure might not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

In the following description of the embodiments, when a parameter is referred to as being "predetermined", it may be intended to mean that a value of the parameter is determined in advance when the parameter is used in a process or an algorithm. The value of the parameter may be set when the process or the algorithm starts or may be set during a period that the process or the algorithm is executed.

It will be understood that although the terms "first", "second", "third" etc. are used herein to describe various elements, these elements should not be limited by these terms. These terms are only used to distinguish one element from another element. Thus, a first element in some embodiments could be termed a second element in other embodiments without departing from the teachings of the present disclosure.

Further, it will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

FIG. 1 is a view, schematically illustrating an example of a data processing system, including a memory system, according to an embodiment of the present disclosure.

Referring to FIG. 1, a data processing system 100 may include a host 110 and a memory system 120.

The host 110 may include various wired and/or wireless electronic devices, such as a mobile phone, an MP3 player, a laptop computer, a desktop computer, a game console, a TV, and a projector. In addition, the host 110 may include at least one operating system (OS). This operating system may manage and control the functions and operations of the host 110 generally and may be executed in response to a request of a user by using the data processing system 100 or the memory system 120.

The memory system 120 may execute various operations in response to a request from the host 110. In particular, the memory system 120 may store data that is accessed by the host 110. That is, the memory system 120 may be used as a main memory device or an auxiliary memory device of the host 110.

The memory system 120 may include a memory device 140 that stores data and a logic device 130 that controls the operation of the memory device 140.

The memory device 140 may store data that is accessed by the host 110 and may include volatile memory, such as dynamic random access memory (DRAM) and static random access memory (SRAM), nonvolatile memory, such as NAND flash, resistive random access memory (RRAM), phase-change random access memory (PRAM), magneto-resistive random access memory (MRAM), and ferroelectric random access memory (FRAM), or a combination thereof.

The logic device 130 may control the memory device 140 in response to a request from the host 110. As an example, the logic device 130 may provide data that is read from the memory device 140 to the host 110 or may store data that is provided from the host 110 in the memory device 140. The logic device 130 may include a central processing unit (CPU), a controller, an application specific integrated circuit (ASIC), an application processor (AP), or the like.

More specifically, the logic device 130 may include a host interface unit 132, a memory interface unit 134, a processor 136, or the like.

The host interface unit 132 may be used for interfacing with the host 110 and may process commands and data of the host 110. The host interface unit 132 may be implemented to communicate with the host 110 through at least one of various interface protocols.

The memory interface unit 134 may be used for interfacing with the memory device 140, may generate a control signal, may transmit the control signal to the memory device 140, and may process data based on the processor 136 to be described later. The memory interface unit 134 may also be implemented to communicate with the memory device 140 through at least one of various interface protocols.

The processor 136 may control the overall operation of the memory system 120. For example, the processor 136 may perform read/write/erase operations on the memory device 140 in response to read/write/erase requests from the host 110. Alternatively, for example, the processor 136 may control various background operations for the memory device 140.

Although not shown, in addition to the host interface unit 132, the memory interface unit 134, and the processor 136, the logic device 140 may further include units for performing various functions required, for example, a temporary memory device, a power management unit, or the like.

Meanwhile, in order for the logic device 130 to perform an operation, such as receiving a command from the host 110 or transferring data to the host 110, a signal transmission path between the login device 130 and the host 110, in particular, between the host interface unit 132 and the host 110, may be required. This signal transmission path is indicated by arrow ①.

In addition, in order for the logic device 130 to access the memory device 140 that is under the control of the processor 136 and perform read/write/erase operations, a signal transmission path between the logic device 130 and the memory device 140, in particular, between the memory interface unit 134 and the memory device 140, may be required. This signal transmission path is indicated by arrow ②.

In addition, power may be required for the logic device 130 to operate. This power may include various levels of power voltage or ground voltage that are required for the logic device 130. Accordingly, a power supply path between the logic device 130 and an external device (not shown) may be required. This power supply path is indicated by arrow ③.

In addition, power may be required for the memory device 140 to operate. This power may include various levels of power voltage or ground voltage that are required for the memory device 140. Accordingly, a power supply path between the memory device 140 and an external device (not shown) may be required. This power supply path is indicated by an arrow ④.

In the data processing system 100 described above, the memory device 140 may be implemented as one or more memory chips, and the logic device 130 may be implemented as one or more logic chips. Furthermore, the memory system 120 with the memory device 140 and the logic device 130 may be implemented in one package. That is, the memory system 120 may be implemented as a system in package (SIP) in which a memory chip and a logic chip are integrated in one package. This will be described in more detail with reference to the following drawings.

Figure 2:
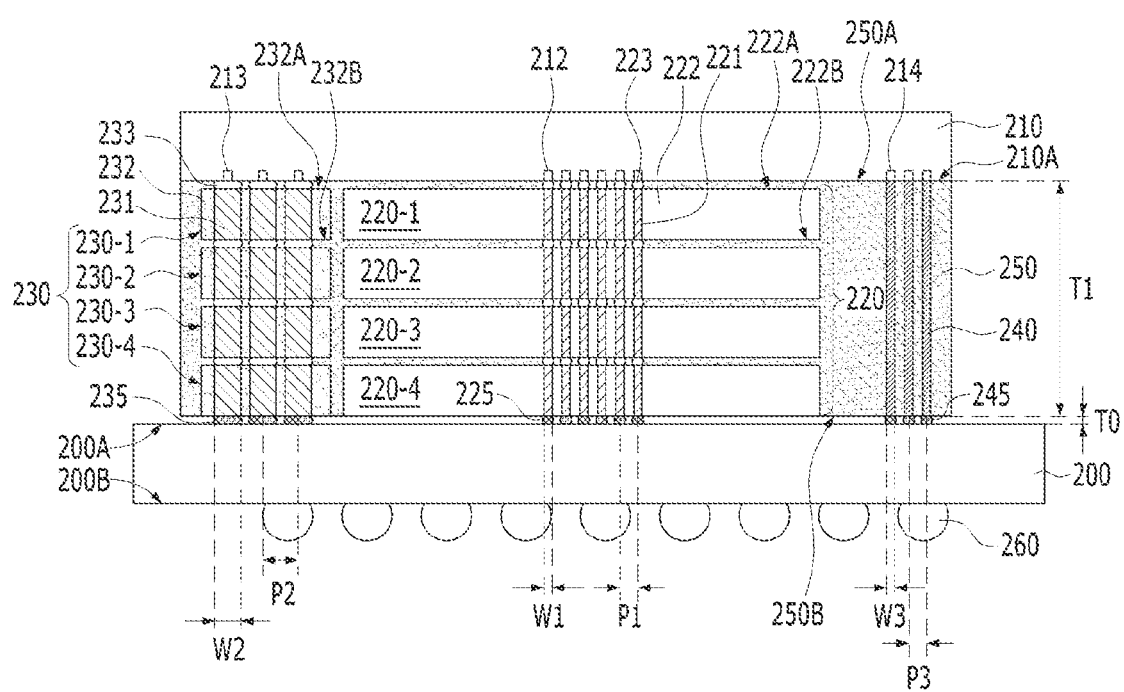
FIG. 2 is a cross-sectional view, illustrating a semiconductor package, according to an embodiment of the present disclosure.

FIG. 2 is a cross-sectional view, illustrating a semiconductor package, according to an embodiment of the present disclosure.

Referring to FIG. 2, a semiconductor package of the present embodiment may include a base layer 200, a first semiconductor chip 210, a second semiconductor chip stack 220, a bridge die stack 230, a vertical interconnector 240, a molding layer 250, and an external connection terminal 260.

The base layer 200 may include a first surface 200A and a second surface 200B. The first surface 200A may be used for disposing the first semiconductor chip 210, the second semiconductor chip stack 220, the bridge die stack 230, and the vertical interconnector 240. The second surface 200B may be used for disposing the external connection terminal 260 and may be positioned on the opposite side of the first surface 200A. Although not shown, the base layer 200 may include a circuit and/or wiring structure for the electrical connection between the second semiconductor chip stack 220 and the external connection terminal 260, between the bridge die stack 230 and the external connection terminal 260, and between the vertical interconnector 240 and the external connection terminal 260. For example, the base layer 200 may include a substrate for a semiconductor package, such as a printed circuit board (PCB), a redistribution layer, an interposer, or a combination thereof. In addition, although not shown, pads to connect with the second semiconductor chip stack 220, the bridge die stack 230, and the vertical interconnector 240 may be disposed on the first surface 200A of the base layer 200, and pads to connect with the external connection terminal 260 may be disposed on the second surface 200B of the base layer 200. These pads may be parts of the circuit and/or wiring structure of the base layer 200.

The first semiconductor chip 210 may be disposed over the first surface 200A of the base layer 200 and spaced apart from the first surface 200A of the base layer 200 by a predetermined distance. Although not shown, the first semiconductor chip 210 may include a semiconductor body, such as silicon, and an integrated circuit formed in the semiconductor body and with various functions. The integrated circuit may be implemented in various ways according to the type of the first semiconductor chip 210. For example, when the second semiconductor chips 220-1, 220-2, 220-3, and 220-4 to be described later are memory chips, the first semiconductor chip 210 may be a logic chip for controlling the memory chips. The first semiconductor chip 210 may substantially correspond to the logic device 130 of FIG. 1 described above.

The first semiconductor chip 210 may be disposed such that one surface 210A faces the first surface 200A of the base layer 200. Here, the one surface 210A of the first semiconductor chip 210 may be an active surface on which chip pads 212, 213, and 214 of the first semiconductor chip 210 are disposed. The chip pads 212, 213, and 214 of the first semiconductor chip 210 may include a first chip pad 212 that is electrically connected to the second semiconductor chip stack 220, a second chip pad 213 that is electrically connected to the bridge die stack 230, and a third chip pad 214 that is electrically connected to the vertical interconnector 240.

Here, the first chip pad 212 may be used for signal transmission with the second semiconductor chip stack 220, and the third chip pad 214 may be used for signal transmission with an external component (not shown). In this case, because the number of input/output signals that are transmitted between the first semiconductor chip 210 and the second semiconductor chip stack 220 and between the first semiconductor chip 210 and the external component is very large, a plurality of first chip pads 212 and a plurality of third chip pads 214 may be disposed relatively densely. In other words, the spacing and/or pitch between the first chip pads 212 and the spacing and/or pitch between the third chip pads 214 may be small. For reference, the pitch may refer to the distance between the center of a certain component and the center of an adjacent component. On the other hand, the second chip pad 213 may be used for supplying power to the first semiconductor chip 210. Because the supplying of power is relatively small compared to the number of input/output signals, the plurality of second chip pads 213 may be disposed relatively sparsely. In other words, the spacing and/or pitch between the second chip pads 213 may be large. The area in which the first chip pads 212 are disposed, the area in which the second chip pads 213 are disposed, and the area in which the third chip pads 214 are disposed may be spaced apart from each other in a horizontal direction.

The space between the first semiconductor chip 210 and the base layer 200 may be used for forming the second semiconductor chip stack 220, the bridge die stack 230, and the vertical interconnector 240. Accordingly, the first semiconductor chip 210 may have a large plan area that covers the second semiconductor chip stack 220, the bridge die stack 230, and the vertical interconnector 240.

The second semiconductor chip stack 220 may be disposed between the first surface 200A of the base layer 200 and the one surface 210A of the first semiconductor chip 210. Furthermore, the second semiconductor chip stack 220 may overlap a region in which the first chip pads 212 are disposed to connect with the first chip pads 212.

The second semiconductor chip stack 220 may include a plurality of second semiconductor chips 220-1, 220-2, 220-3, and 220-4 that are stacked in a vertical direction. In the present embodiment, the case in which four second semiconductor chips 220-1, 220-2, 220-3, and 220-4 are stacked is illustrated. However, the present disclosure is not limited thereto, and the number of second semiconductor chips that are included in the second semiconductor chip stack 220 may be modified in various ways.

Each of the plurality of second semiconductor chips 220-1, 220-2, 220-3, and 220-4 may include a via 221, a body portion 222, and a connection electrode 223.

The body portion 222 may have a first surface 222A that faces the first semiconductor chip 210, and a second surface 222B that is located on the opposite side of the first surface 222A. In addition, although not shown, the body portion 222 may include a semiconductor body, such as silicon, and an integrated circuit with various functions while being formed in the semiconductor body. The integrated circuit may be variously implemented based on the type of the second semiconductor chips 220-1, 220-2, 220-3, and 220-4. For example, when the second semiconductor chips 220-1, 220-2, 220-3, 220-4 are memory chips, the integrated circuit may include a memory array that includes a plurality of memory cells. The second semiconductor chips 220-1, 220-2, 220-3, and 220-4 may include volatile memory, such as dynamic random access memory (DRAM) and static random access memory (SRAM), or nonvolatile memory, such as NAND flash, resistive random access memory (RRAM), phase-change random access memory (PRAM), magneto-resistive random access memory (MRAM), and ferroelectric random access memory (FRAM). The second semiconductor chip stack 220 may substantially correspond to the memory device 140 of FIG. 1 described above.

The via 221 may extend in the vertical direction to penetrate through the body portion 222 and may have a pillar shape. In the vertical direction, one end of the via 221 may be exposed at substantially the same level as the first surface 222A of the body portion 222, and the other end of the via 221 may be exposed at substantially the same level as the second surface 222B of the body portion 222. When each of the second semiconductor chips 220-1, 220-2, 220-3, and 220-4 includes a silicon body, the via 221 may include a TSV (Through Silicon Via). The number and arrangement of a plurality of vias 221 included in each of the second semiconductor chips 220-1, 220-2, 220-3, and 220-4 may be substantially the same as the number and arrangement of the first chip pads 212. Accordingly, the vias 221 may be disposed relatively densely. Because the vias 221 are disposed relatively densely, the vias 221 may be formed to have a relatively small width W1 and a pitch P1. The via 221 may include a metal, such as copper (Cu), tin (Sn), silver (Ag), tungsten (W), nickel (Ni), ruthenium (Ru), cobalt (Co), or a compound of this metal.

The connection electrode 223 may be formed to be connected to the one end of the via 221 on the first surface 222A of the body portion 222. The connection electrodes 223 of the second semiconductor chips 220-1, 220-2, 220-3, and 220-4 may be connected to the via 221 of the second semiconductor chips 220-2, 220-3, and 220-4, and the first chip pad 212 of the first semiconductor chip 210 immediately lying thereover, respectively. In the present embodiment, any one connection electrode 223 is shown to directly contact the other end of the via 221 positioned thereover while directly contacting the one end of the via 221 positioned thereunder, in the vertical direction. However, the present disclosure is not limited thereto, and the connection electrode 223 may be electrically connected to the via 221 through a redistribution layer (not shown) formed over the first surface 222A and/or the second surface 222B of the body portion 222. The number and arrangement of the connection electrodes 223 may be substantially the same as the number and arrangement of the vias 221 and/or the number and arrangement of the first chip pads 212. This connection electrode 223 may be, as an example, a conductive bump. In particular, the connection electrode 223 may include a solder material that can be bonded to the via 221. However, the present disclosure is not limited thereto, and the connection electrode 223 may include various metal materials, solder materials, or a combination thereof. In addition, the connection electrode 223 may have various shapes, such as a pillar shape, a ball shape, or a combination thereof.

Accordingly, through the vias 221 and the connection electrodes 223, electrical connection between the plurality of second semiconductor chips 220-1, 220-2, 220-3, and 220-4, and electrical connection between the second semiconductor chip stack 220 and the first semiconductor chip 210 may be possible.

The bridge die stack 230 may be disposed between the first surface 200A of the base layer 200 and the one surface 210A of the first semiconductor chip 210. Further, the bridge die stack 230 may overlap a region in which the second chip pads 213 are disposed to connect with the second chip pads 213. In a horizontal direction, the bridge die stack 230 may be disposed at one side of the second semiconductor chip stack 220 and spaced apart from the second semiconductor chip stack 220 by a predetermined distance.

The bridge die stack 230 may include a plurality of bridge dies 230-1, 230-2, 230-3, and 230-4 stacked in the vertical direction. In the present embodiment, four bridge dies 230-1, 230-2, 230-3, and 230-4 are stacked. However, the present disclosure is not limited thereto, and bridge dies that are included in the bridge die stack 230 may be modified in various ways. Furthermore, in the present embodiment, the number of the bridge dies 230-1, 230-2, 230-3, and 230-4 may be the same as the number of the second semiconductor chips 220-1, 220-2, 220-3, and 220-4, and the thickness of each of the bridge dies 230-1, 230-2, 230-3, and 230-4 in the vertical direction may be substantially the same as the thickness of each of the second semiconductor chip 220-1, 220-2, 220-3, and 220-4. In particular, the thicknesses of the body portion 232 and the connection electrode 233 of each of the bridge dies 230-1, 230-2, 230-3, and 230-4 may be substantially the same as the thickness of the body portion 222 and the connection electrode 223 of each of the second semiconductor chips 220-1, 220-2, 220-3, and 220-4. However, the number of the bridge dies 230-1, 230-2, 230-3, and 230-4, the thickness of each of the bridge dies 230-1, 230-2, 230-3, and 230-4, the thickness of the body portion 232, and the thickness of the connection electrode 233 may have various values, regardless of the number of the second semiconductor chips 220-1, 220-2, 220-3, and 220-4, the thickness of each of the second semiconductor chips 220-1, 220-2, 220-3, and 220-4, the thickness of the body portion 222, and the thickness of the connection electrode 223. However, the thickness of the bridge die stack 230 may be substantially the same as the thickness of the second semiconductor chip stack 220 (see T1).

Each of the plurality of bridge dies 230-1, 230-2, 230-3, and 230-4 may include a conductive pillar 231, an insulating body 232, and the connection electrode 233.

The insulating body 232 may have a first surface 232A that faces the first semiconductor chip 210 and a second surface 232B that is located on the opposite side of the first surface 232A. The insulating body 232 may simply serve to provide a space in which the conductive pillar 231 is to be formed. For this reason, unlike the body portion 222 described above, the insulating body 232 might not include an electrical component, such as an integrated circuit therein. That is, the insulating body 232 may include only an insulating material. In the present embodiment, the insulating body 232 may include a molding material, such as EMC (Epoxy Molding Compound). The reason is to firmly support the conductive pillar 231 with a relatively large width W2 by surrounding the sidewall of the conductive pillar 231. However, the present disclosure is not limited thereto, and the insulating body 232 may include various insulating materials.

The conductive pillar 231 may extend in the vertical direction to penetrate through the insulating body 232. The number and arrangement of the conductive pillars 231 included in each of the bridge dies 230-1, 230-2, 230-3, and 230-4 may be substantially the same as the number and arrangement of the second chip pads 213. Accordingly, the conductive pillars 231 may be disposed relatively sparsely. In the vertical direction, one end of the conductive pillar 231 may be exposed at substantially the same level as the first surface 232A of the insulating body 232, and the other end of the conductive pillar 231 may be exposed at substantially the same level as the second surface 232B of the insulating body 232. The conductive pillar 231 may include a metal, such as copper (Cu), tin (Sn), silver (Ag), tungsten (W), nickel (Ni), ruthenium (Ru), cobalt (Co), or a compound of this metal.

Here, the width W2 and the pitch P2 of the conductive pillar 231 in the horizontal direction may be greater than the width W1 and the pitch P1 of the via 221 described above, and/or the width W3 and the pitch P3 of the vertical interconnector 240 to be described later. Because the conductive pillars 231 are disposed relatively sparsely compared to the vias 221 and/or the vertical interconnectors 240, and thus have a large pitch P2, it may be possible to increase the width W2 of the conductive pillar 231. This is because even if the width W2 of the conductive pillar 231 is increased to some extent, an electrical short between adjacent conductive pillars 231 might not occur. The reason for increasing the width W2 of the conductive pillar 231 is to stably supply power to the first semiconductor chip 210. This will be described in more detail later.

The connection electrode 233 may be formed to be connected to the one end of the conductive pillar 231 on the first surface 222A of the insulating body 232. The connection electrodes 233 of the plurality of bridge dies 230-1, 230-2, 230-3, and 230-4 may be connected to the conductive pillar 231 of the bridge dies 230-2, 230-3, and 230-4, and the second chip pad 213 of the first semiconductor chip 210 immediately lying thereover, respectively. The connection electrode 233 may be, as an example, a conductive bump. In particular, the connection electrode 233 may include a solder material capable of bonding to the conductive pillar 231. However, the present disclosure is not limited thereto, and the connection electrode 233 may include various metal materials, solder materials, or a combination thereof. In addition, the connection electrode 233 may have various shapes, such as a pillar shape, a ball shape, or a combination thereof. Because the width W2 of the conductive pillar 231 in the horizontal direction is greater than the width W1 of the via 221, in consideration of this, the width of the connection electrode 233 in the horizontal direction may be greater than the width of the connection electrode 223 of the second semiconductor chips 220-1, 220-2, 220-3, and 220-4.

Accordingly, through the conductive pillars 231 and the connection electrodes 233, electrical connection between the plurality of bridge dies 230-1, 230-2, 230-3, and 230-4, and electrical connection between the bridge die stack 230 and the first semiconductor chip 210 may be possible.

The vertical interconnector 240 may be disposed between the first surface 200A of the base layer 200 and the one surface 210A of the first semiconductor chip 210. Furthermore, the vertical interconnector 240 may have one end connected to the third chip pad 214, and may extend toward the base layer 200 in the vertical direction. In the horizontal direction, the vertical interconnector 240 may be disposed to be spaced apart from the second semiconductor chip stack 220 and the bridge die stack 230 by a predetermined distance. In the present embodiment, it is illustrated that the vertical interconnector 240 is positioned at the opposite side of the bridge die stack 230 with the second semiconductor chip stack 220 therebetween, but the present disclosure is not limited thereto. The positions of the second semiconductor chip stack 220, the bridge die stack 230, and the vertical interconnector 240 may be determined in consideration of the positions of the regions in which the chip pads 212, 213, and 214 of the first semiconductor chip 210 are disposed.

The number and arrangement of the vertical interconnectors 240 may be substantially the same as the number and arrangement of the third chip pads 214. Accordingly, the vertical interconnectors 240 may be disposed relatively densely. Because the vertical interconnectors 240 are disposed relatively densely, the vertical interconnector 240 may be formed to have a relatively small width W3 and a pitch P3. The vertical interconnector 240 may be a vertical bonding wire.

The length of the vertical interconnector 240 in the vertical direction may be substantially the same as the thickness of the second semiconductor chip stack 220 and/or the thickness of the bridge die stack 230 (see T1).

Meanwhile, the second semiconductor chip stack 220, the bridge die stack 230, and the vertical interconnector 240 described above may be in contact with the one surface 210A of the first semiconductor chip 210, but may be spaced apart from the first surface 200A of the base layer 200 by a predetermined distance. Therefore, additional connection electrodes 225, 235, and 245 may be further formed between the first surface 200A of the base layer 200 and each of the second semiconductor chip stack 220, the bridge die stack 230, and the vertical interconnector 240, for electrically connecting them to each other. The connection electrode 225 between the second semiconductor chip stack 220 and the base layer 200 will be referred to as a first additional connection electrode 225. The connection electrode 235 between the bridge die stack 230 and the base layer 200 will be referred to as a second additional connection electrode 235. The connection electrode 245 between the vertical interconnector 240 and the base layer 200 will be referred to as a third additional connection electrode 245. The first additional connection electrode 225, the second additional connection electrode 235, and the third additional connection electrode 245 may have substantially the same thickness (see T0).

The first additional connection electrode 225 may be connected to the other end of the via 221 of the second semiconductor chip 220-4 closest to the base layer 200 and the first surface 200A of the base layer 200. The second additional connection electrode 235 may be connected to the other end of the conductive pillar 231 of the bridge die 230-4 closest to the base layer 200 and the first surface 200A of the base layer 200. The third additional connection electrode 245 may be connected to the other end of the vertical interconnector 240 and the first surface 200A of the base layer 200. As a result, the second semiconductor chip stack 220 may be electrically connected to the base layer 200 by the first additional connection electrode 225. The bridge die stack 230 may be electrically connected to the base layer 200 by the second additional connection electrode 235. The vertical interconnector 240 may be electrically connected to the base layer 200 by the third additional connection electrode 245. However, the present disclosure is not limited thereto, and the first additional connection electrode 225, the second additional connection electrode 235, and the third additional connection electrode 245 may be omitted. In this case, the other end of the via 221, the other end of the conductive pillar 231, and the other end of the vertical interconnector 240 may directly contact the first surface 200A of the base layer 200, and thus electrical connection between the second semiconductor chip stack and the base layer 200, between the bridge die stack 230 and the base layer 200, and between the vertical interconnector 240 and the base layer 200 may be possible.

A molding layer 250 may be disposed between the base layer 200 and the first semiconductor chip 210, and may surround the sidewalls of the second semiconductor chip stack 220, the bridge die stack 230, and the vertical interconnector 240 to mold them. The molding layer 250 may include a molding material, such as EMC. The molding layer 250 may be formed of the same material as the insulating body 232 of the bridge dies 230-1, 230-2, 230-3, and 230-4. The molding layer 250 may include a first surface 250A in contact with the one surface 210A of the first semiconductor chip 210 and a second surface 250B positioned on the opposite side of the first surface 250A. The second surface 250B may be positioned at substantially the same level as the second surface 222B of the body portion 222 of the second semiconductor chip 220-4 closest to the base layer 200, the second surface 232B of the insulating body 232 of the bridge die 230-4 closest to the base layer 200, and the other end of the vertical interconnector 240 to expose them. Accordingly, the first to third additional connection electrodes 225, 235, and 245 might not be covered by the molding layer 250. In this case, the space between the base layer 200 and the molding layer 250 and the space between the first to third additional connection electrodes 225, 235, and 245 may be further filled with an underfill material (not shown), or the like. However, the present disclosure is not limited thereto, and the molding layer 250 may fill the entire space between the base layer 200 and the first semiconductor chip 210.

A signal transmission path and a power supply path in the semiconductor package of the present embodiment will be described as follows.

First, the signal transmission between the first semiconductor chip 210 and an external component (not shown), for example, a host, may be performed through an external connection terminal 260 for external signal transmission, the base layer 200, the third additional connection electrode 245, and the vertical interconnector 240. When the first semiconductor chip 210 corresponds to the logic device 130 of FIG. 1, described above, such a signal transmission path may correspond to the arrow ① of FIG. 1.

Next, the signal transmission between the first semiconductor chip 210 and the second semiconductor chip stack 220 may be performed through the via 221 and the connection electrode 223. When the first semiconductor chip 210 and the second semiconductor chip stack 220 correspond to the logic device 130 and the memory device 140 of FIG. 1, respectively, such a signal transmission path may correspond to the arrow ② of FIG. 1.

Next, the power supply to the first semiconductor chip 210 may be performed through an external connection terminal 260 for power supply, the base layer 200, the second additional connection electrode 235, the conductive pillar 231, and the connection electrode 233. When the first semiconductor chip 210 corresponds to the logic device 130 of FIG. 1, described above, such a power supply path may correspond to the arrow ③ of FIG. 1.

Next, the power supply to the second semiconductor chip stack 220 may be performed through an external connection terminal 260 for power supply, the base layer 200, the first additional connection electrode 225, the via 221, and the connection electrode 223. When the second semiconductor chip stack 220 corresponds to the memory device 140 of FIG. 1, described above, such a power supply path may correspond to the arrow ④ of FIG. 1.

According to the semiconductor package described above, the following effects may occur.

When the first semiconductor chip 210 is a logic chip, it may include a logic circuit that consumes a large amount of power, and thus, it may have high heat generation characteristics. However, when the first semiconductor chip 210 is disposed at the uppermost portion of the semiconductor package as in the present embodiment, the heat generated may be easily escaped upward, and thus, such a heating problem may be solved.

However, when the first semiconductor chip 210 is disposed at the uppermost portion, the distance to the base layer 200 may increase. Therefore, the power supply to the first semiconductor chip 210 may be problematic. However, by supplying power to the first semiconductor chip 210 by using the bridge die stack 230 with the conductive pillar 231 with a relatively large width W2 as in the present embodiment, the resistance of the power supply path may be reduced, and a fusing phenomenon in which the power supply path is cut off by a high current flow may be prevented. That is, it may be possible to smoothly supply power to the first semiconductor chip 210.

Here, because the second chip pads 213 that supplies power to the first semiconductor chip 210 are formed relatively sparsely and the gap between them is large, it may be possible to increase only the width W2 of the conductive pillar 231. On the other hand, because the third chip pads 214 for signal transmission to the first semiconductor chip 210 are formed relatively densely, it may be possible to connect the third chip pads 214 to the vertical interconnector 240 with a small width W3. In other words, by forming the signal transmission path and the power supply path to the first semiconductor chip 210 asymmetrically, it may be possible to easily supply power to the first semiconductor chip 210 without changing the arrangement of the chip pads 212, 213, and 214 of the first semiconductor chip 210.

Further, when a molding material is used as the insulating body 232 that surrounds the conductive pillar 231, the conductive pillar 231 may be firmly supported, as well as a planarization process, described later (see FIG. 5D), may be easily performed. Regarding the planarization process, it will be described in more detail in the relevant section.

In the semiconductor package described above, the case in which the first semiconductor chip 210 is a logic chip and the second semiconductor chips 220-1, 220-2, 220-3, and 220-4 are memory chips has been described. However, the present disclosure is not limited thereto. If the first semiconductor chip 210 has a larger flat area and consumes more power and/or generates more heat during operation, compared to the second semiconductor chips 220-1, 220-2, 220-3, and 220-4, the present disclosure may be applied.

In addition, in the semiconductor package that is described above, the power supply path to the first semiconductor chip 210 may be formed by using the conductive pillar 231 and the connection electrode 233 which have relatively large widths, and the signal transmission path of the first semiconductor chip 210 may be formed by using the vertical interconnector 240 that has a relatively small width. However, the present disclosure is not limited thereto. If a width of a first interconnector for supplying power to the first semiconductor chip 210 is greater than a width of a second interconnector for signal transmission of the first semiconductor chip 210, the structure, shape, or the like of the first and second interconnectors may be modified in various ways. In the present embodiment, the stacked structure of the conductive pillar 231 and the connection electrode 233, connected in the vertical direction in the bridge die stack 230, may correspond to the first interconnector, and the vertical interconnector 240 may correspond to the second interconnector. On the other hand, in the embodiment of FIG. 6 to be described later, a conductive pillar 631 and a connection electrode 633, connected in the vertical direction in a first bridge die stack 630, may correspond to the first interconnector, and a via 641 and a connection electrode 643, connected in the vertical direction in a second bridge die stack 640, may correspond to the second interconnector.

Figure 3:
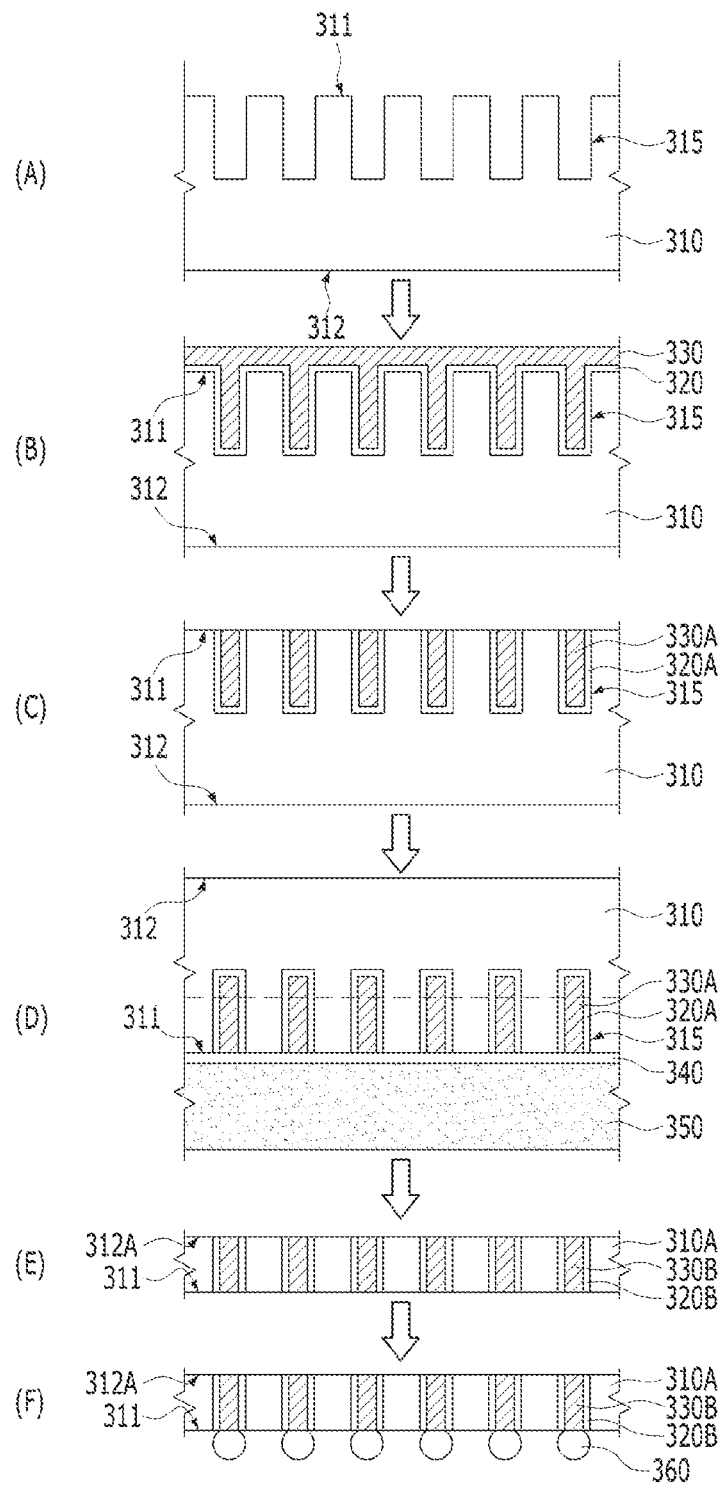
FIG. 3 is a view, schematically illustrating a forming process of a semiconductor chip, according to an embodiment of the present disclosure.

FIG. 3 is a view, schematically illustrating a forming process of a semiconductor chip, according to an embodiment of the present disclosure. The process of FIG. 3 may be used for forming any one of the second semiconductor chips 220-1, 220-2, 220-3, and 220-4 of FIG. 2.

Referring to FIG. 3, in step (A), a hole 315 may be formed by etching a semiconductor body 310. The hole 315 may be formed to a predetermined depth from a first surface 311 to a second surface 312 of the semiconductor body 310. In this case, the depth of the hole 315 may be less than the thickness of the semiconductor body 310. In addition, because the hole 315 is formed by etching the semiconductor body 310, it may be possible to reduce the width of the hole 315 and the gap between the holes 315. That is, it may be possible to form the hole 315 with a fine pitch. The semiconductor body 310 may be formed of a semiconductor material, such as silicon, and may include an integrated circuit (not shown) therein.

Subsequently, in step (B), an insulating layer 320 may formed along the first surface 311 of the semiconductor body 310 with the hole 315, and then a conductive layer 330 with a sufficient thickness to fill the hole 315 may be formed over the insulating layer 320. The insulating layer 320 may be used for insulating between the conductive layer 330 and the semiconductor body 310, and may include various insulating materials, such as silicon oxide, silicon nitride, or a combination thereof. The conductive layer 330 may be used for forming vias, and may include various conductive materials, for example, a metal, such as copper (Cu), tin (Sn), silver (Ag), tungsten (W), nickel (Ni), ruthenium (Ru), and cobalt (Co), or a compound of this metal.

Subsequently, in step (C), a planarization process may be performed so that the first surface 311 of the semiconductor body 310 is exposed. The planarization process may include, for example, a chemical mechanical polishing (CMP) process. As a result, an insulating layer pattern 320A and a conductive layer pattern 330A filled in the hole 315 may be formed. The conductive layer pattern 330A may have a pillar shape, and the side and bottom surfaces of the conductive layer pattern 330A may be surrounded by the insulating layer pattern 320A.

Subsequently, in step (D), a carrier substrate 350 may be attached to the first surface 311 of the semiconductor body 310 by using an adhesive material 340, and then the semiconductor body 310 may be turned over. As a result, the upper and lower positions of the first surface 311 and the second surface 312 of the semiconductor body 310 may be reversed. That is, in this step, the first surface 311 may be positioned below the second surface 312.

Subsequently, a thinning process may be performed on the second surface 312 up to the height shown by the dotted line. The thinning process may be performed by grinding, CMP, etching, or the like.

Subsequently, debonding may be performed to remove the carrier substrate 350.

The resultant structure in which the thinning process is performed and the carrier substrate 350 is removed, is shown in step (E). In step (E), the semiconductor body 310A with a reduced thickness may have a first surface 311 and a final second surface 312A. A final conductive layer pattern 330B may penetrate through the semiconductor body 310A and may have one end and the other end that are exposed at the first surface 311 and the final second surface 312A, respectively. A final insulating layer pattern 320B may be interposed between the final conductive layer pattern 330B and the semiconductor body 310A while surrounding sidewalls of the final conductive layer pattern 330B.

Subsequently, in step (F), a connection electrode 360 that is connected to the one end of the final conductive layer pattern 330B may be formed. Accordingly, a semiconductor chip may be formed.

The semiconductor body 310A with the first surface 311 and the final second surface 312A, the final conductive layer pattern 330B, and the connection electrode 360 may correspond to the body portion 222 with the first surface 222A and the second surface 222B of the second semiconductor chips 220-1, 220-2, 220-3, and 220-4, the via 221, and the connection electrode 223, respectively. Although not shown in FIG. 2, each of the second semiconductor chips 220-1, 220-2, 220-3, and 220-4 may further include a component that corresponds to the final insulating layer pattern 320B.

Figure 4:
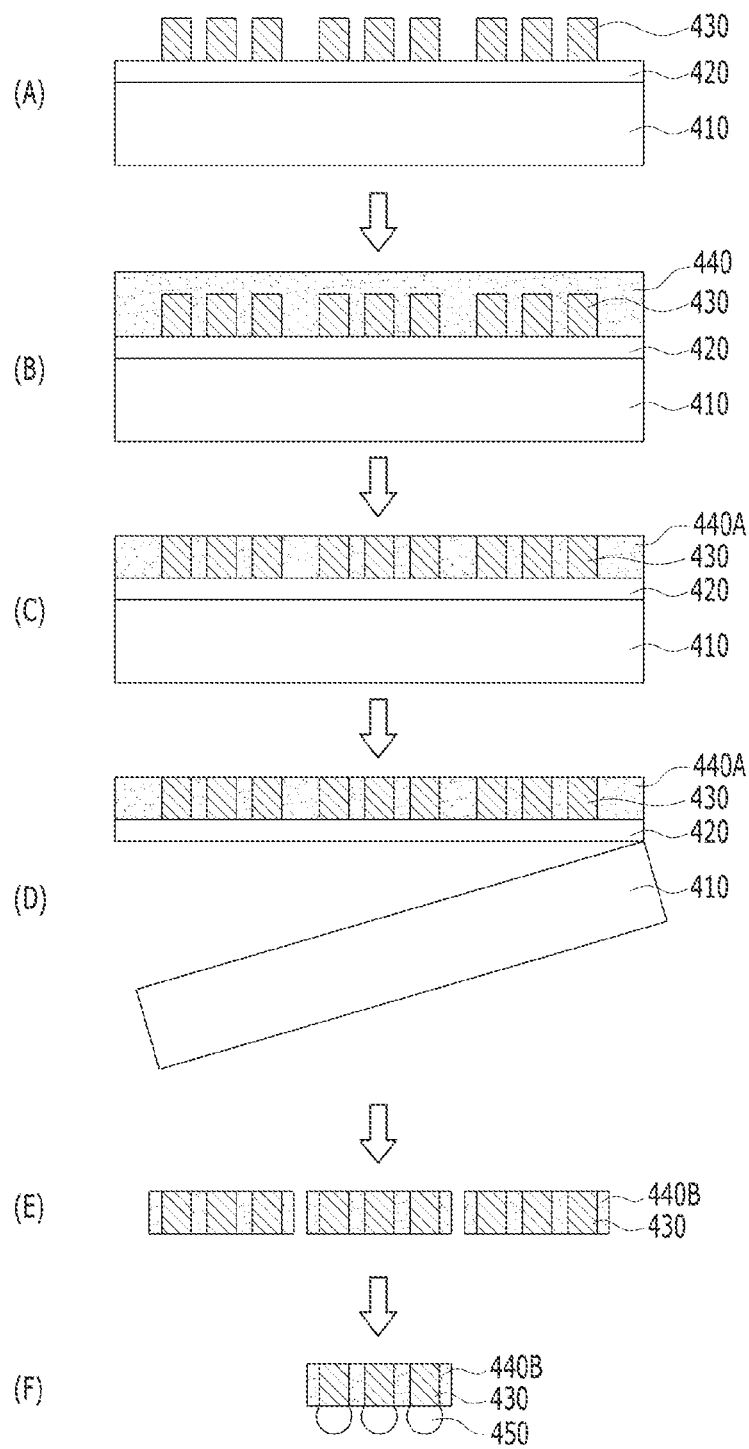
FIG. 4 is a view, schematically illustrating a forming process of a bridge die, according to an embodiment of the present disclosure.

FIG. 4 is a view, schematically illustrating a forming process of a bridge die, according to an embodiment of the present disclosure. The process of FIG. 4 may be used for forming any one of the bridge dies 230-1, 230-2, 230-3, and 230-4 of FIG. 2.

Referring to FIG. 4, in step (A), a conductive pillar 430 may be formed over the carrier substrate 410 on which an adhesive material 420 is formed.

Subsequently, in step (B), an insulating layer 440 may be formed over the carrier substrate 410 to a thickness that covers the conductive pillar 430. As an example, the insulating layer 440 may be a molding material, such as EMC.

Subsequently, in step (C), a planarization process may be performed on the insulating layer 440 so that the upper surface of the conductive pillar 430 is exposed. When the insulating layer 440 includes a molding material, the planarization process may be performed by grinding the molding material. As a result, an insulating layer pattern 440A, filling between the conductive pillars 430 and surrounding the sidewalls of the conductive pillar 430, may be formed.

Subsequently, in step (D), the carrier substrate 410 may be removed by performing debonding.

Subsequently, in step (E), the resultant structure of the process in step (D) may diced to be divided into a plurality of dies. Dicing may be performed on the insulating layer pattern 440A, and the diced insulating layer pattern 440A is indicated by a reference numeral 440B below. In this case, each die may include the conductive pillars 430 with a required number/array and the insulating layer pattern 440B, the insulating layer pattern 440B surrounding the conductive pillars 430.

Subsequently, in step (F), a connection electrode 450 that is connected to one end of the conductive pillar 430 of each die may be formed. Accordingly, a bridge die may be formed.

The insulating layer pattern 440B, the conductive pillar 430, and the connection electrode 450 of the bridge die of the present embodiment may correspond to the insulating body 232, the conductive pillar 231, and the connection electrode 233 of the bridge dies 230-1, 230-2, 230-3, and 230-4 of FIG. 2, respectively.

FIGS. 5A to 5F are cross-sectional views, illustrating a method for fabricating a semiconductor package, according to an embodiment of the present disclosure. The processes of FIGS. 5A to 5F may be used for forming a semiconductor package equal to/similar to the semiconductor package of FIG. 2. Detailed descriptions of parts that are substantially the same as those of the above-described embodiments will be omitted.

Figure 5A:
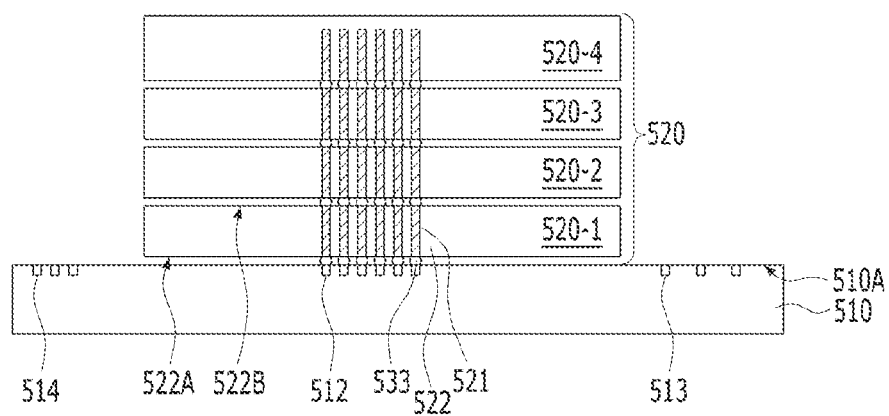
FIGS. 5A to 5F are cross-sectional views, illustrating a method for fabricating a semiconductor package, according to an embodiment of the present disclosure.

Referring to FIG. 5A, a first semiconductor chip 510 may be provided. The first semiconductor chip 510 may be disposed such that one surface 510A on which first to third chip pads 512, 513, and 514 are disposed faces upward. That is, the first semiconductor chip 510 may be disposed in a face-up state.

Subsequently, a plurality of second semiconductor chips 520-1, 520-2, 520-3, and 520-4 may be vertically stacked over the one surface 510A of the first semiconductor chip 510 to form a second semiconductor chip stack 520. In this case, except for the second semiconductor chip 520-4 that is farthest from the first semiconductor chip 510, each of the remaining second semiconductor chips 520-1, 520-2, and 520-3 may be stacked in a state of being performed up to step (F) of FIG. 3 described above. On the other hand, the second semiconductor chip 520-4 that is farthest from the first semiconductor chip 510 may be stacked over the remaining second semiconductor chips 520-1, 520-2, and 520-3 in a state of being performed up to step (E) of FIG. 3. However, the present disclosure is not limited thereto, and the second semiconductor chip 520-4 may also be stacked in a state of being performed up to step (F) of FIG. 3. That is, the second semiconductor chip 520-4 may be the same as each of the remaining second semiconductor chips 520-1, 520-2, and 520-3.

Each of the plurality of second semiconductor chips 520-1, 520-2, 520-3, and 520-4 may include a body portion 522 with a first surface 522A and a second surface 522B, the second surface 522B on the opposite side of the first surface 522A, a via 521 penetrating through the body portion 522, and a connection electrode 523 connected to one end of the via 521 on the first surface 522A of the body portion 522. The first surface 522A of the body portion 522 may be disposed to face the one surface 510A of the first semiconductor chip 510. The connection electrode 523 may be disposed to be connected to the vias 521 positioned thereunder and thereover in the vertical direction and connect them to each other. Further, the connection electrode 523 of the second semiconductor chip 520-1 closest to the first semiconductor chip 510 may be disposed to be connected to the first chip pad 512.

Figure 5B:
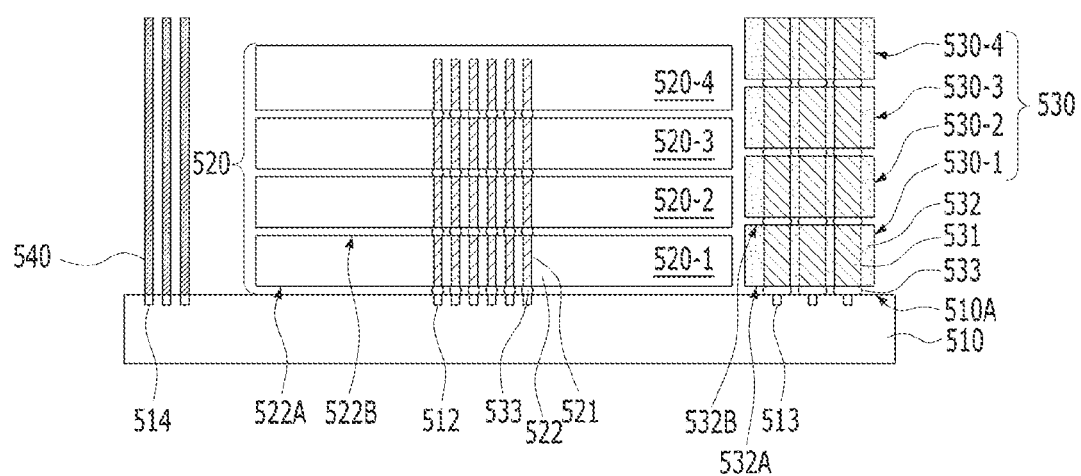

Referring to FIG. 5B, a plurality of bridge dies 530-1, 530-2, 530-3, and 530-4 may be vertically stacked over the one surface 510A of the first semiconductor chip 510 to form a bridge die stack 530. Each of the plurality of bridge dies 530-1, 530-2, 530-3, and 530-4 may be formed by the processes of FIG. 4, described above.

Each of the plurality of bridge dies 530-1, 530-2, 530-3, and 530-4 may include an insulating body 532 with a first surface 532A and a second surface 532B, the second surface 532B on the opposite side of the first surface 532A, a conductive pillar 531 penetrating through the insulating body 532, and a connection electrode 533 that is connected to one end of the conductive pillar 531 on the first surface 532A of the insulating body 532. The first surface 532A of the insulating body 532 may be disposed to face the one surface 510A of the first semiconductor chip 510. The connection electrode 533 may be disposed to be connected to the conductive pillars 531 that are positioned thereunder and thereover in the vertical direction and connect them to each other. Further, the connection electrode 533 of the bridge die 530-1 that is closest to the first semiconductor chip 510 may be disposed to be connected to the second chip pad 513.

In the present embodiment, the case in which the thickness of the bridge die stack 530 is greater than the thickness of the second semiconductor chip stack 520 is illustrated. However, the present disclosure is not limited thereto, and the thickness of the bridge die stack 530 may be greater than or equal to the thickness of the second semiconductor chip stack 520.

In addition, a vertical interconnector 540 that extends in the vertical direction may be formed over the one surface 510A of the first semiconductor chip 510. The vertical interconnector 540 may have one end that is connected to the third chip pad 514.

When the vertical interconnector 540 is a vertical bonding wire, the method of forming the vertical interconnector 540 will be briefly described as follows. First, one end of a wire may be bonded to the third chip pad 514 by using a wire bonding machine (not shown). The wire may include a metal, such as gold, silver, copper, platinum, or an alloy thereof that can be welded to the third chip pad 514 by ultrasonic energy and/or heat. Subsequently, the bonded wire may be pulled in a vertical direction away from the first semiconductor chip 210, for example, from bottom to top, by using the wire bonding machine. Then, when the wire is extended to the desired length, the wire may be cut. Accordingly, the vertical interconnector 540 with one end that is bonded to the third chip pad 514 and the other end that is positioned at a predetermined height from the one surface 510A of the first semiconductor chip 510 may be formed. In the present embodiment, the case in which the height of the other end of the vertical interconnector 540 is greater than the height of the second semiconductor chip stack 520 is illustrated. That is, the case in which the length of the vertical interconnector 540 in the vertical direction is greater than the thickness of the second semiconductor chip stack 520 is illustrated. However, the present disclosure is not limited thereto, and the length of the vertical interconnector 540 may be greater than or equal to the thickness of the second semiconductor chip stack 520.

The process of forming the second semiconductor chip stack 520 of FIG. 5A, the process of forming the bridge die stack 530 of FIG. 5B, and the process of forming the vertical interconnector 540 may be performed in any order.

Figure 5C:
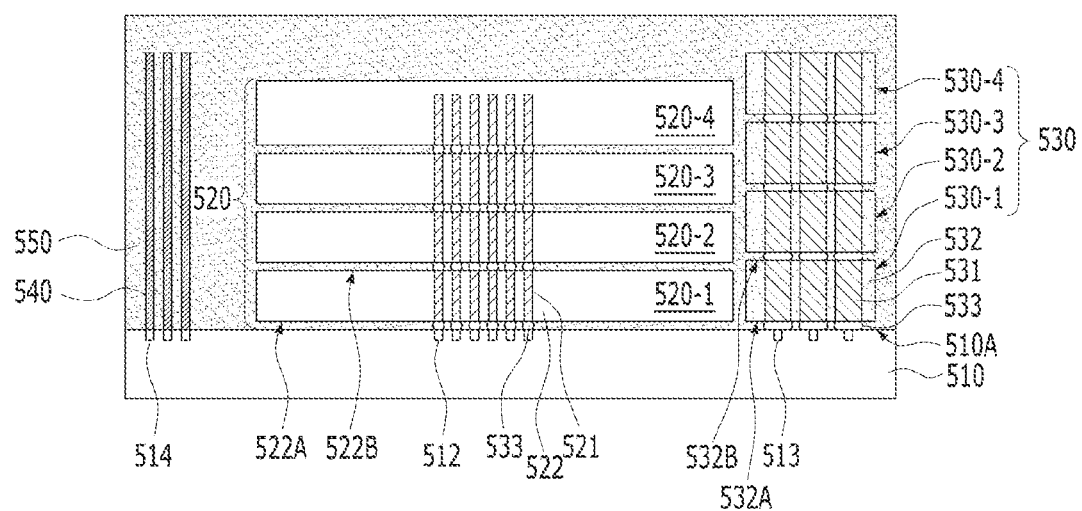

Referring to FIG. 5C, a molding layer 550 may be formed over the one surface 510A of the first semiconductor chip 510 with a thickness sufficient to cover the second semiconductor chip stack 520, the bridge die stack 530, and the vertical interconnector 540.

Figure 5D:
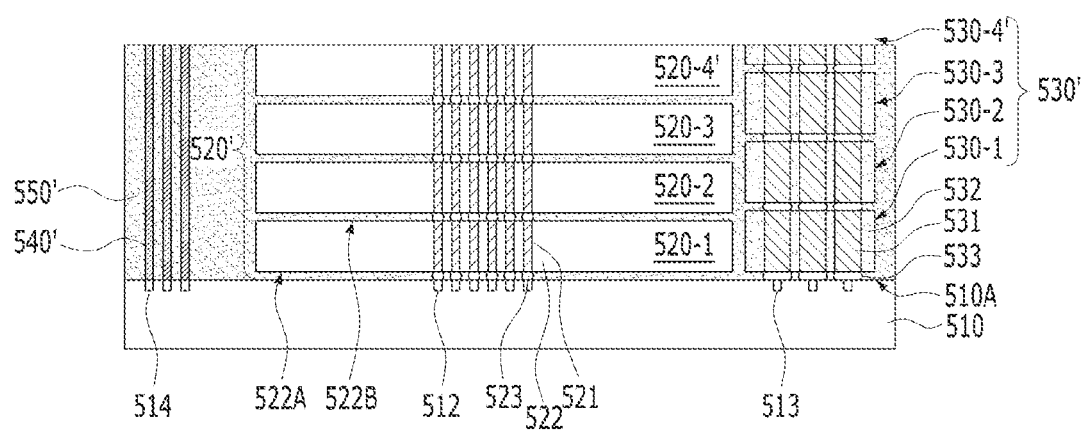

Referring to FIG. 5D, a planarization process, such as grinding, may be performed until the via 521 of the second semiconductor chip 520-4 that is farthest from the first semiconductor chip 510 is exposed. When the insulating body 532 of the bridge die stack 530 is formed of the same material as the molding layer 550, grinding may be performed more easily.

Through the planarization process, a final second semiconductor chip 520-4' and a final second semiconductor chip stack 520' with the final second semiconductor chip 520-4' may be formed. The final second semiconductor chip 520-4' may have a thickness that is reduced more than that of the second semiconductor chip 520-4, and both ends of the via 521 in the final second semiconductor chip 520-4' may be exposed. Also, a final bridge die 530-4' and a final bridge die stack 530' with the final bridge die 530-4' may be formed. The final bridge die 530-4' may have a thickness that is reduced than that of the bridge die 530-4. In addition, a final vertical interconnector 540' with a reduced length in the vertical direction may be formed. In addition, a final molding layer 550' with a reduced thickness may be formed.

Through this process, the final second semiconductor chip stack 520', the final bridge die stack 530', the final vertical interconnector 540', and the final molding layer 550' may have the same thickness.

Figure 5E:
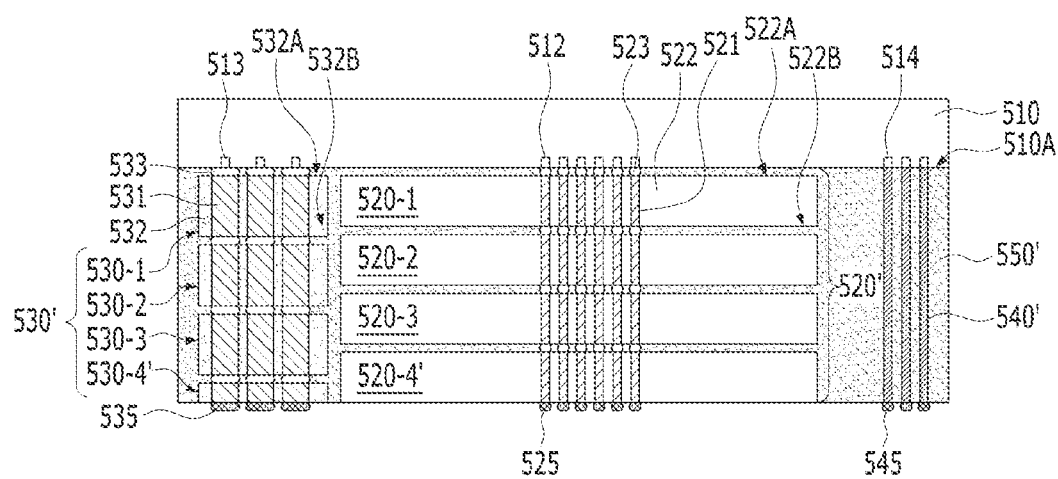

Referring to FIG. 5E, the resultant structure of the process of FIG. 5D may be rotated 180 degrees. As a result, the top, bottom, left and right of the resultant structure of FIG. 5D may be changed.

In addition, a first additional connection electrode 525 may be formed on the other end of the via 521 of the final second semiconductor chip stack 520' that is exposed by the final molding layer 550' to be connected thereto. In addition, a second additional connection electrode 535 may be formed on the other end of the conductive pillar 531 of the final bridge die stack 530' that is exposed by the final molding layer 550 to be connected thereto. In addition, a third additional connection electrode 545 may be formed on the other end of the final vertical interconnector 540' that is exposed by the final molding layer 550' to be connected thereto.

Figure 5F:
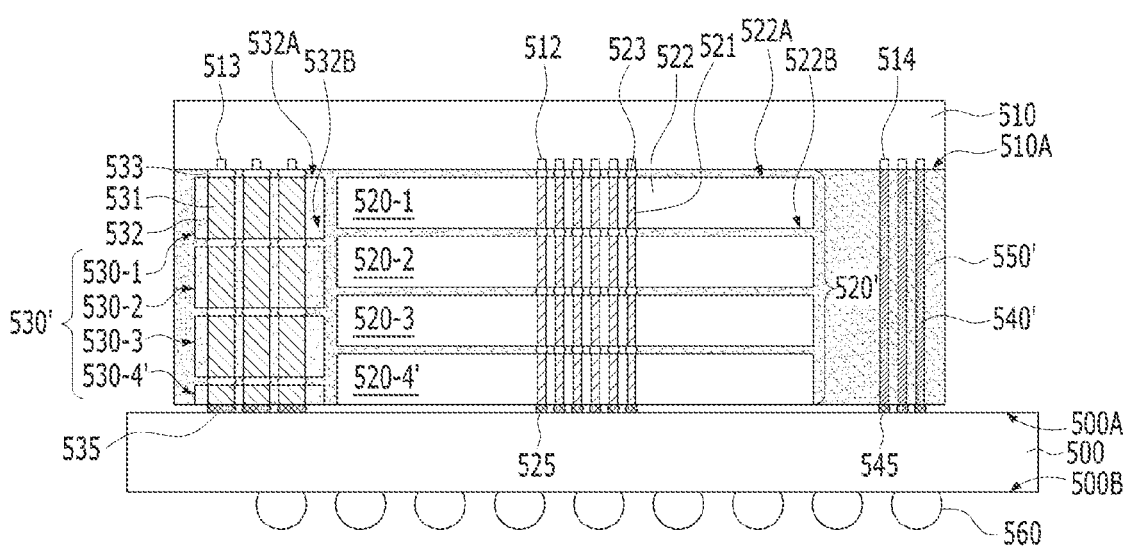

Referring to FIG. 5F, the first to third additional connection electrodes 525, 535, and 545 may be connected to a first surface 500A of a base layer 500. In addition, an external connection terminal 560 that is connected to a second surface 500B of the base layer 500 may be formed.

Accordingly, as shown in FIG. 5F, a structure in which the final second semiconductor chip stack 520', the final bridge die stack 530', the final vertical interconnector 540', and the final molding layer 550' are formed over the first surface 500A of the base layer 500, and the first semiconductor chip 510 is stacked thereon, may be obtained.

Figure 6:
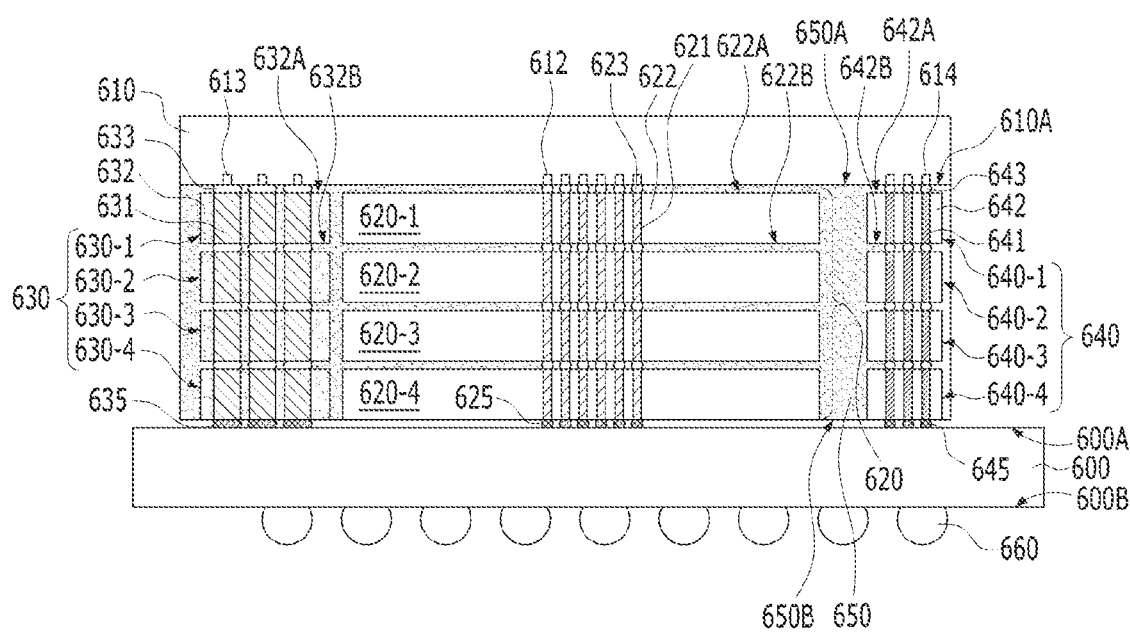
FIG. 6 is a cross-sectional view, illustrating a semiconductor package, according to another embodiment of the present disclosure.

FIG. 6 is a cross-sectional view, illustrating a semiconductor package, according to another embodiment of the present disclosure. Detailed descriptions of parts that are substantially the same as those of the embodiment of FIG. 2 will be omitted.

Referring to FIG. 6, a semiconductor package of the present embodiment may include a base layer 600, a first semiconductor chip 610, a second semiconductor chip stack 620, a first bridge die stack 630, a second bridge die stack 640, a molding layer 650, and an external connection terminal 660.

The base layer 600 may be substantially the same as the base layer 200 of the embodiment of FIG. 2. The second semiconductor chip stack 620, the first bridge die stack 630, and the second bridge die stack 640 may be disposed over a first surface 600A of the base layer 600, and the external connection terminal 660 may be disposed over a second surface 600B of the base layer 600.

The first semiconductor chip 610 may be disposed over the second semiconductor chip stack 620, the first bridge die stack 630, and the second bridge die stack 640. The first semiconductor chip 610 may be substantially the same as the first semiconductor chip 210 of FIG. 2.

The second semiconductor chip stack 620 may include a plurality of second semiconductor chips 620-1, 620-2, 620-3, and 620-4 stacked in a vertical direction. Each of the plurality of second semiconductor chips 620-1, 620-2, 620-3, and 620-4 may include a body portion 622 with a first surface 622A and a second surface 622B, a via 621, and a connection electrode 623. The second semiconductor chip stack 620 may be connected to a first chip pad 612 that is disposed on one surface 610A of the first semiconductor chip 610 through the uppermost connection electrode 623 and may be connected to the base layer 200 through a first additional connection electrode 625 that is connected to the lowermost via 612. The second semiconductor chip stack 620 may be substantially the same as the semiconductor chip stack 220 of FIG. 2.

The first bridge die stack 630 may include a plurality of first bridge dies 630-1, 630-2, 630-3, and 630-4 that are stacked in the vertical direction. Each of the plurality of first bridge dies 630-1, 630-2, 630-3, and 630-4 may include an insulating body 632 with a first surface 632A and a second surface 632B, a conductive pillar 631, and a connection electrode 633. The first bridge die stack 630 may be connected to a second chip pad 613 that is disposed on the one surface 610A of the first semiconductor chip 610 through the uppermost connection electrode 633 and may be connected to the base layer 200 through a second additional connection electrode 635 that is connected to the lowermost conductive pillar 631. The first bridge die stack 630 may be substantially the same as the bridge die stack 230 of FIG. 2.

The second bridge die stack 640 may include a plurality of second bridge dies 640-1, 640-2, 640-3, and 640-4 stacked in the vertical direction. Each of the plurality of second bridge dies 640-1, 640-2, 640-3, and 640-4 may include a semiconductor body 642 with a first surface 642A and a second surface 642B, a via 641, and a connection electrode 643. The second bridge die stack 640 may be connected to a third chip pad 614 that is disposed on the one surface 610A of the first semiconductor chip 610 through the uppermost connection electrode 643 and may be connected to the base layer 200 through a fourth additional connection electrode 645 that is connected to the lowermost via 641. The second bridge die stack 640 may be a structure that is used instead of the vertical interconnector 240 of FIG. 2 and will be described in more detail below.

The semiconductor body 642 may simply serve to provide a space in which the via 641 is to be formed. For this reason, unlike the body portion 622 that is described above, the semiconductor body 642 might not include electrical components, such as an integrated circuit therein. That is, the semiconductor body 642 may include only a semiconductor material, such as silicon.

The via 641 may penetrate through the semiconductor body 642. The via 641 may be formed to have a small width and a small pitch that is similar to the above-described vertical interconnector 240. Because the via 641 is formed by using a process that is similar to the process of FIG. 3, described above, it may be possible to form the via 641 with a small width and a small pitch. When the semiconductor body 642 includes silicon, the via 641 may be a TSV. Although not shown, an insulating material may be interposed between the via 641 and the semiconductor body 642.

The connection electrode 643 may be connected to one end of the via 641 and may include a conductive bump.

According to the semiconductor package of the present embodiment, a signal transmission path between the first semiconductor chip 610 and an external component (not shown) may pass through the external connection terminal 640, the base layer 600, the third additional connection electrode 645, the via 641, and the connection electrode 643.

In the case of the present embodiment, all the effects of the embodiment of FIG. 2 may be obtained.

Further, capacitance that is generated by the via 641, the semiconductor body 642, and an insulating layer (not shown) therebetween may be reduced by using the via 641 with a small width. This is because this capacitance is proportional to the contact area between the via 641 and the semiconductor body 642. If the capacitance is reduced, it may be advantageous for high-speed signal transmission.

Figure 7:
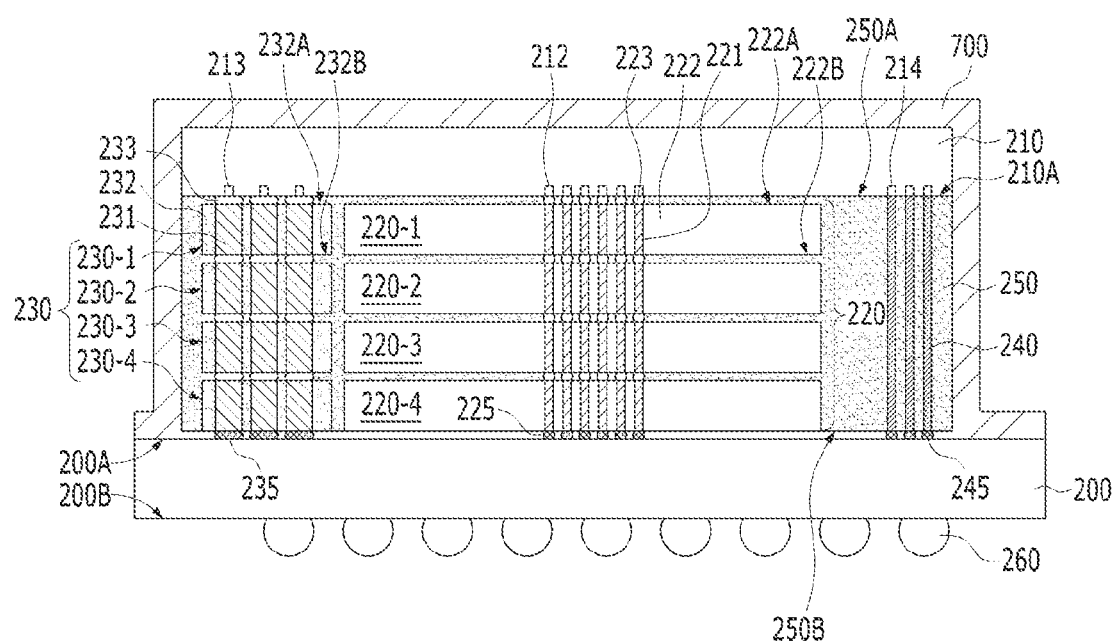
FIG. 7 is a cross-sectional view, illustrating a semiconductor package, according to another embodiment of the present disclosure.

FIG. 7 is a cross-sectional view, illustrating a semiconductor package, according to another embodiment of the present disclosure. In the semiconductor package of FIG. 7, a heat dissipation member is added to the components of the semiconductor package of FIG. 2. Parts that are the same as those in the embodiment of FIG. 2 are denoted by the same reference numerals and the description thereof is omitted.

Referring to FIG. 7, a heat dissipation member 700 may be further formed over a whole surface of the structure of FIG. 2. That is, the heat dissipation member 700 may be formed along the first surface 200A of the base layer 200, a side surface of the molding layer 250, and a side surface and an upper surface of the first semiconductor chip 210.

The heat dissipation member 700 may include a material with a high thermal conductivity, for example, a metal, such as silver (Ag), aluminum (Al), copper (Cu), platinum (Au), zinc (Zn), nickel (Ni), and iron (Fe), or a compound of this metal. Although not shown, an interface material with an adhesive property, such as a thermal interface material (TIM), may be interposed between the heat dissipation member 700 and the structure of FIG. 2.

In the case of the present embodiment, because heat that is generated from the first semiconductor chip 210 is discharged to the outside through the side and upper surfaces of the first semiconductor chip 210, the heat dissipation characteristic of the first semiconductor chip 210 may be further improved.

Meanwhile, the shape of the heat dissipation member 700 is not limited to the one that is illustrated and may have various shapes while in contact with at least a portion of the upper surface of the first semiconductor chip 210.

Further, although not shown, the heat dissipation member 700 may also be formed over a whole surface of the structure of FIG. 6. That is, the heat dissipation member 700 may be formed along the first surface 600A of the base layer 600, a side surface of the molding layer 650, and a side surface and an upper surface of the first semiconductor chip 610.

According to the above embodiments of the present disclosure, it may be possible to provide a semiconductor package capable of improving heat dissipation characteristics and facilitating power supply.

Figure 8:
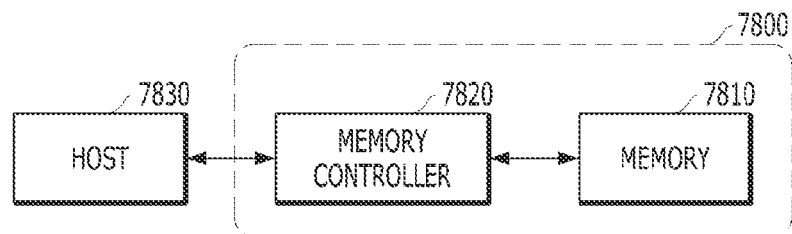
FIG. 8 shows a block diagram illustrating an electronic system employing a memory card including a semiconductor package, according to an embodiment.

FIG. 8 shows a block diagram illustrating an electronic system including a memory card 7800 employing at least one of the semiconductor packages according to the embodiments. The memory card 7800 includes a memory 7810, such as a nonvolatile memory device, and a memory controller 7820. The memory 7810 and the memory controller 7820 may store data or read out the stored data. At least one of the memory 7810 and the memory controller 7820 may include at least one of the semiconductor packages according to described embodiments.

The memory 7810 may include a nonvolatile memory device to which the technology of the embodiments of the present disclosure is applied. The memory controller 7820 may control the memory 7810 such that stored data is read out or data is stored in response to a read/write request from a host 7830.

Figure 9:
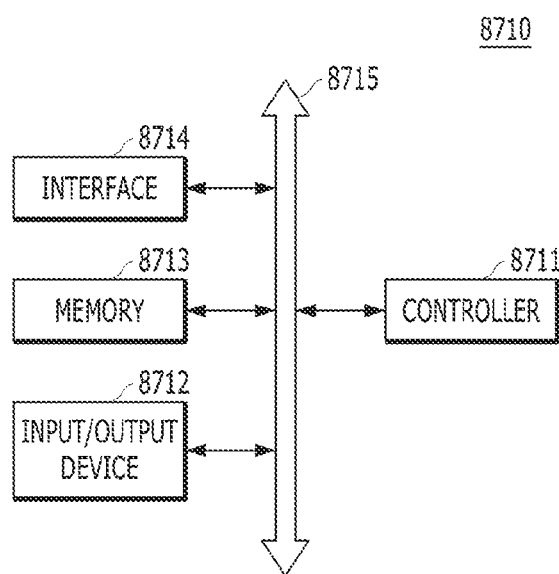
FIG. 9 shows a block diagram illustrating another electronic system including a semiconductor package, according to an embodiment.

FIG. 9 shows a block diagram illustrating an electronic system 8710 including at least one of the semiconductor packages according to described embodiments. The electronic system 8710 may include a controller 8711, an input/output device 8712, and a memory 8713. The controller 8711, the input/output device 8712, and the memory 8713 may be coupled with one another through a bus 8715 providing a path through which data move.

In an embodiment, the controller 8711 may include one or more microprocessor, digital signal processor, microcontroller, and/or logic device capable of performing the same functions as these components. The controller 8711 or the memory 8713 may include one or more of the semiconductor packages according to the embodiments of the present disclosure. The input/output device 8712 may include at least one selected among a keypad, a keyboard, a display device, a touchscreen and so forth. The memory 8713 is a device for storing data. The memory 8713 may store data and/or commands to be executed by the controller 8711, and the like.

The memory 8713 may include a volatile memory device such as a DRAM and/or a nonvolatile memory device such as a flash memory. For example, a flash memory may be mounted to an information processing system such as a mobile terminal or a desktop computer. The flash memory may constitute a solid state disk (SSD). In this case, the electronic system 8710 may stably store a large amount of data in a flash memory system.

The electronic system 8710 may further include an interface 8714 configured to transmit and receive data to and from a communication network. The interface 8714 may be a wired or wireless type. For example, the interface 8714 may include an antenna or a wired or wireless transceiver.

The electronic system 8710 may be realized as a mobile system, a personal computer, an industrial computer, or a logic system performing various functions. For example, the mobile system may be any one of a personal digital assistant (PDA), a portable computer, a tablet computer, a mobile phone, a smart phone, a wireless phone, a laptop computer, a memory card, a digital music system, and an information transmission/reception system.

If the electronic system 8710 represents equipment capable of performing wireless communication, the electronic system 8710 may be used in a communication system using a technique of CDMA (code division multiple access), GSM (global system for mobile communications), NADC (north American digital cellular), E-TDMA (enhanced-time division multiple access), WCDMA (wideband code division multiple access), CDMA2000, LTE (long term evolution), or Wibro (wireless broadband Internet).

Although various embodiments have been described for illustrative purposes, it will be apparent to those skilled in the art that various changes and modifications may be made without departing from the spirit and scope of the present teachings as defined in the following claims.

What is claimed is:

1. A semiconductor package comprising:
   a base layer;
   a first semiconductor chip disposed over and spaced apart from the base layer;
   a semiconductor chip stack disposed between the base layer and the first semiconductor chip, the semiconductor chip stack including a plurality of second semiconductor chips that are stacked in a vertical direction;
   a bridge die stack disposed between the base layer and the first semiconductor chip and disposed to be spaced apart from the semiconductor chip stack, the bridge die stack including a plurality of bridge dies that are stacked in the vertical direction and electrically connecting the first semiconductor chip and the base layer to supply power; and
   a vertical interconnector disposed between the base layer and the first semiconductor chip and disposed to be spaced apart from the semiconductor chip stack and the bridge die stack, and electrically connecting the first semiconductor chip and the base layer to transmit a signal.

2. The semiconductor package according to claim 1, wherein each of the plurality of bridge dies comprises:
an insulating body;
a conductive pillar penetrating through the insulating body; and
a first connection electrode connected to one end of the conductive pillar,
wherein a width of the conductive pillar is greater than a width of the vertical interconnector.

3. The semiconductor package according to claim 2, wherein a pitch of the conductive pillar is greater than a pitch of the vertical interconnector.

4. The semiconductor package according to claim 2, wherein the insulating body includes a molding material.

5. The semiconductor package according to claim 2, wherein each of the plurality of second semiconductor chips comprises:
a body portion including a semiconductor material and a circuit structure;
a via penetrating through the body portion; and
a second connection electrode connected to one end of the via,
wherein a width of the conductive pillar is greater than a width of the via.

6. The semiconductor package according to claim 5, wherein a pitch of the conductive pillar is greater than a pitch of the via.

7. The semiconductor package according to claim 2, further comprising:
a molding layer that molds the bridge die stack, the semiconductor chip stack, and the vertical interconnector between the base layer and the first semiconductor chip,
wherein the insulating body includes the same material as the molding layer.

8. The semiconductor package according to claim 1, wherein the vertical interconnector includes a vertical bonding wire.

9. The semiconductor package according to claim 1, wherein a thickness of the semiconductor chip stack, a thickness of the bridge die stack, and a length of the vertical interconnector are the same.

10. The semiconductor package according to claim 1, wherein the first semiconductor chip has a planar area that covers the bridge die stack, the semiconductor chip stack, and the vertical interconnector.

11. The semiconductor package according to claim 1, further comprising:
a heat dissipation member formed over at least a portion of the first semiconductor chip.

12. The semiconductor package according to claim 1, wherein a thickness of a bridge die that is closest to the base layer, among the plurality of bridge dies, is less than a thickness of each of remaining bridge dies.

13. A semiconductor package comprising:
a base layer;
a first semiconductor chip disposed over and spaced apart from the base layer;
a semiconductor chip stack disposed between the base layer and the first semiconductor chip, the semiconductor chip stack including a plurality of second semiconductor chips that are stacked in a vertical direction;
a first bridge die stack disposed between the base layer and the first semiconductor chip and disposed to be spaced apart from the semiconductor chip stack, the first bridge die stack including a plurality of first bridge dies that are stacked in the vertical direction and electrically connecting the first semiconductor chip and the base layer to supply power; and
a second bridge die stack disposed between the base layer and the first semiconductor chip and disposed to be spaced apart from the semiconductor chip stack and the first bridge die stack, the second bridge die stack including a plurality of second bridge dies that are stacked in the vertical direction and electrically connecting the first semiconductor chip and the base layer to transmit a signal,
wherein the first bridge die stack and the second bridge die stack are different from each other.

14. The semiconductor package according to claim 13, wherein each of the plurality of first bridge dies comprises:
an insulating body;
a conductive pillar penetrating through the insulating body; and
a first connection electrode connected to one end of the conductive pillar, wherein each of the plurality of second bridge dies comprises:
a semiconductor body;
a via penetrating through the semiconductor body; and
a second connection electrode connected to one end of the via, and wherein a width of the conductive pillar is greater than a width of the via.

15. The semiconductor package according to claim 14, wherein a pitch of the conductive pillar is greater than a pitch of the via.

16. The semiconductor package according to claim 14, wherein the insulating body includes a molding material.

17. The semiconductor package according to claim 14, wherein each of the plurality of second semiconductor chips comprises:
a body portion including a semiconductor material and a circuit structure;
a via penetrating through the body portion; and
a third connection electrode connected to one end of the via,
wherein a width of the conductive pillar is greater than a width of the via of each of the plurality of second semiconductor chips.

18. The semiconductor package according to claim 17, wherein a pitch of the conductive pillar is greater than a pitch of the via of each of the plurality of second semiconductor chips.

19. The semiconductor package according to claim 14, further comprising:
a molding layer that molds the first bridge die stack, the semiconductor chip stack, and the second bridge die stack between the base layer and the first semiconductor chip,
wherein the insulating body includes the same material as the molding layer.

20. The semiconductor package according to claim 13, wherein a thickness of the semiconductor chip stack, a thickness of the first bridge die stack, and a thickness of the second bridge die stack are the same.

21. The semiconductor package according to claim 13, wherein the first semiconductor chip has a planar area that covers the first bridge die stack, the semiconductor chip stack, and the second bridge die stack.

22. The semiconductor package according to claim 13, further comprising:
a heat dissipation member formed over at least a portion of the first semiconductor chip.

23. The semiconductor package according to claim 13, wherein a thickness of a first bridge die that is closest to the base layer, among the plurality of first bridge dies, is less than a thickness of each of remaining first bridge dies.

24. A semiconductor package comprising:
a base layer;
a first semiconductor chip disposed over and spaced apart from the base layer;
a semiconductor chip stack disposed between the base layer and the first semiconductor chip, the semiconductor chip stack including a plurality of second semiconductor chips that are stacked in a vertical direction;
a plurality of first interconnectors disposed between the base layer and the first semiconductor chip and disposed to be spaced apart from the semiconductor chip stack, the first interconnector electrically connecting the first semiconductor chip and the base layer and
a plurality of second interconnectors disposed between the base layer and the first semiconductor chip and disposed to be spaced apart from the semiconductor chip stack and the plurality of first interconnectors, the plurality of second interconnectors electrically connecting the first semiconductor chip and the base layer,
wherein each of the plurality of first interconnectors includes a plurality of conductive pillars that are stacked in the vertical direction,
wherein at least one of a horizontal width and a horizontal pitch of each of the conductive pillars is greater than that of each of the plurality of second interconnectors.

* * * * *